(12) United States Patent
Kawanishi et al.

(10) Patent No.: US 7,084,649 B2
(45) Date of Patent: Aug. 1, 2006

(54) METHOD AND APPARATUS FOR MEASURING THREE-DIMENSIONAL DISTRIBUTION OF ELECTRIC FIELD

(75) Inventors: Tetsuya Kawanishi, Koganei (JP); Yoshiro Matsuo, Koganei (JP); Masayuki Izutsu, Koganei (JP)

(73) Assignee: Communications Research Laboratory, Independent Administrative Institution, Koganei (JP)

( * ) Notice: Subject to any disclaimer, the term of this patent is extended or adjusted under 35 U.S.C. 154(b) by 367 days.

(21) Appl. No.: 10/721,408

(22) Filed: Nov. 26, 2003

(65) Prior Publication Data

US 2004/0130341 A1  Jul. 8, 2004

(30) Foreign Application Priority Data

Nov. 26, 2002 (JP) .............................. 2002-342398

(51) Int. Cl.
 *G01R 31/308* (2006.01)
 *G01R 31/28* (2006.01)
(52) U.S. Cl. ...................... 324/753; 324/765
(58) Field of Classification Search .................... None
See application file for complete search history.

(56) References Cited

U.S. PATENT DOCUMENTS

| | | | | |
|---|---|---|---|---|
| 5,272,434 A | * | 12/1993 | Meyrueix et al. | 324/751 |
| 5,412,330 A | * | 5/1995 | Ravel et al. | 324/753 |
| 5,991,036 A | * | 11/1999 | Frankel | 356/364 |
| 6,011,402 A | * | 1/2000 | Kuo et al. | 324/753 |

OTHER PUBLICATIONS

Lo et al; "Proposal for three-dimensional internal field mapping by cw electro-optic probing"; Applied Physics Letters; vol. 50; No. 25; Jun. 22, 1987; pp. 1791-1793.*

S. Miyazawa, Advanced Electronics Series, Category I. vol. I-14 Jul. 10, 1995, pp. 96-101, "Electronics Materials, Properites, Devices, Optical Crystals".

* cited by examiner

*Primary Examiner*—Ernest Karlsen
(74) *Attorney, Agent, or Firm*—Oblon, Spivak, McClelland, Maier & Neustadt, P.C.

(57) ABSTRACT

A method and apparatus are provided that make it possible to speedily measure, and obtain images of, the three-dimensional distribution of electric fields in integrated circuits, using electro-optic sampling. The sampling is performed using a plurality of electric field sensors, each comprising an electro-optic crystal layer, a light-reflecting layer that is in close contact with the electro-optic crystal layer, and a separation layer that is in close contact with the reflection layer, separating the reflection layer from the object to be measured.

10 Claims, 10 Drawing Sheets

METHOD AND APPARATUS FOR MEASURING THREE-DIMENSIONAL DISTRIBUTION OF ELECTRIC FIELD

BACKGROUND OF THE INVENTION

1. Field of the Invention

The present invention relates to a method and apparatus that enables measurement of the three-dimensional distribution of an electric field in microdomains.

2. Description of the Prior Art

Techniques that are used in ultrahigh-speed integrated circuit (IC) development for measuring the electric fields in microdomains include electro-optic sampling (EOS), in which a high-sensitivity electro-optic crystal is brought into proximity to the IC surface to detect fringe electric fields from circuit interconnections.

Figure 9A:
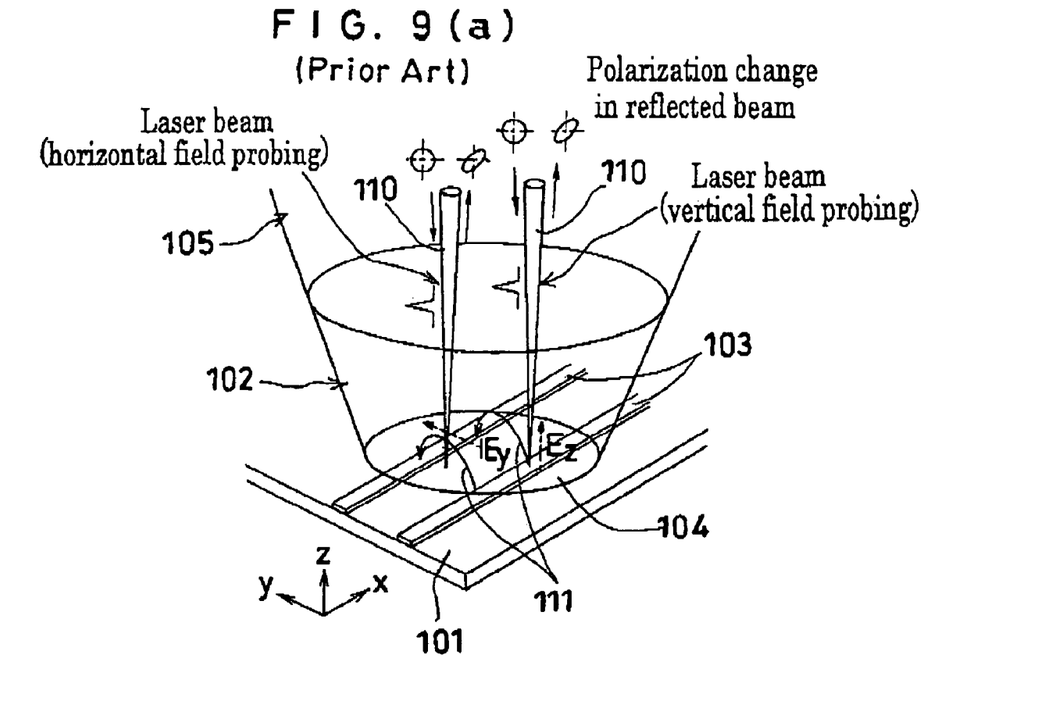
Figure 9B:
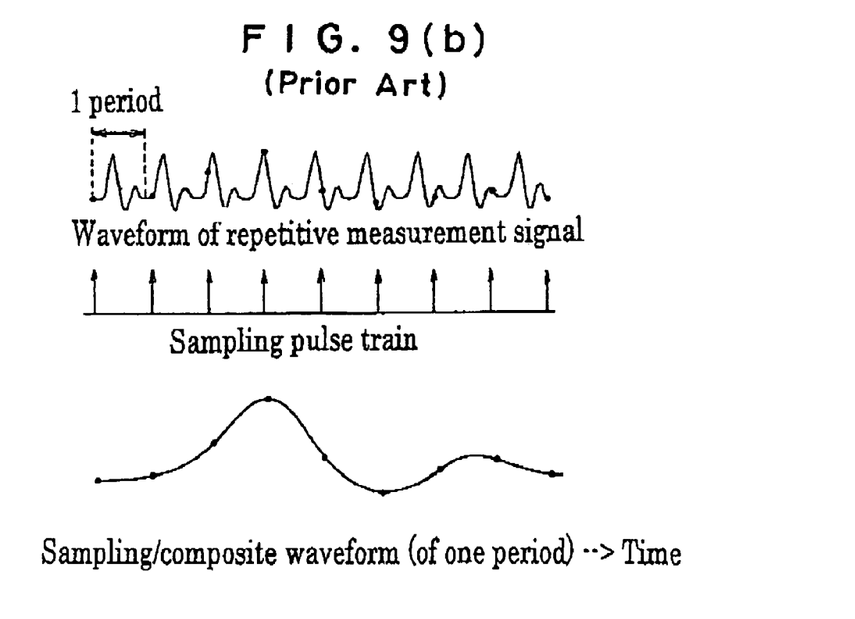

A detailed description of the electro-optic sampling principle is provided by Shintaro Miyazawa, in Advanced Electronics Series, I-14, Category I: Electronics Materials, Properties, Devices, Optical Crystals, pp 96-101. FIG. 9 illustrates the basic principle of electric field measurement using an electro-optic crystal. With reference to FIG. 9(a), when an electro-optic crystal 102 disposed at a probe tip is brought into proximity with an IC substrate 101 to be measured, a fringe electric field 11l leaking into space as a result of a signal in an interconnection 103 or the substrate induces a change in the refractive index of the electro-optic crystal 102, due to the electro-optical effect, with the amount of the change corresponding to the fringe electric field 111. The end face of the electro-optic crystal 102 facing the IC substrate 101 is provided with a dielectric mirror 104 having a high reflection factor. A pulse laser 110 provides the probe beam. The beam, affected by the refractive index of the electro-optic crystal 102, is reflected back in a polarized state corresponding to the refractive index change, and the change in the polarization state of the reflected beam is detected by passing the beam through a polarizing plate (not shown). The electro-optic crystal 102 is maintained by a support 105. With respect to FIG. 9(b), when an electric signal is applied to the interconnection 103, changing the timing of the laser beam relative to the signal enables signal changes in the interconnection to be detected as changes in optical intensity and reproduced. This detection method is known as sampling, a method of sampling the signal amplitude at the same intervals as the pulses. Therefore, with respect to the waveform, the laser beam applied to the object to be measured must be applied as a periodically, repeating signal. The sampling temporal resolution of the pulse laser beam is determined mainly by the pulse width of the beam and the time it takes to pass through a crystal domain where there is an electric field. The response time, which is the time it takes for the double refraction factor to be changed by the electric field, is 100 fsec, which is short enough that it can be ignored. It is considered readily possible to attain a one-picosecond-level response time.

Figure 10A:
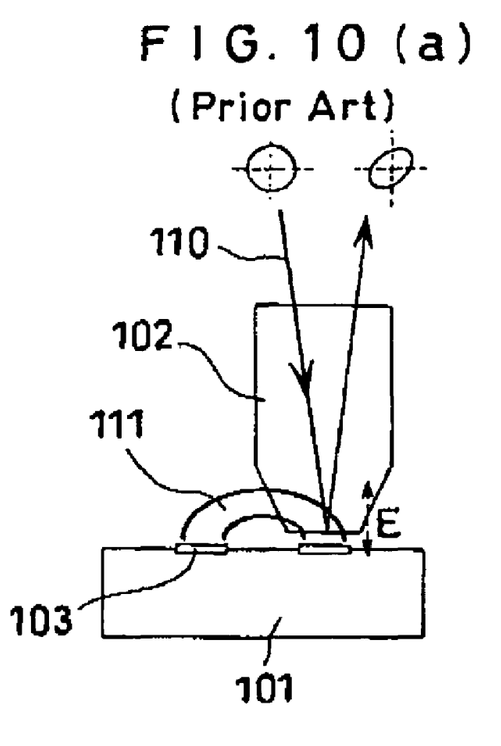
Figure 10B:
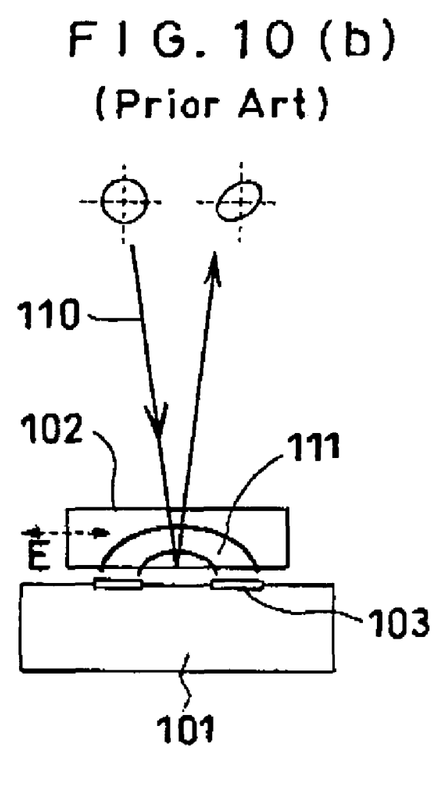

With reference to FIG. 10(a), when the pulse laser 110 irradiates the electro-optic crystal 102 over the interconnection 103, the electro-optic crystal 102 is affected by a vertical leakage electric field (vertical field probing). When the electro-optic crystal 102 irradiated by the pulse laser 110 spans interconnections 103, as in FIG. 10(b), the electro-optic crystal 102 is affected by a horizontal electric field (horizontal field probing). It is therefore necessary to select the electro-optic crystal according to the detected electric field. Table 1 shows the properties of electro-optic crystals used in the EOS methods of the prior art.

TABLE 1

| Crystal | Refractive Index n | Electro-optic Constant $R_{IJ}$ (pm/V) | Permittivity $\epsilon$ | Wavelength ($\geq \mu m$) | Detected Field |
|---|---|---|---|---|---|
| $LiNbO_3$ | 2.23 | 30.8 (33) | 32 | 0.4 | Horizontal Vertical (55° Cutoff) |
| $LiTaO_3$ | 2.14 | 30.3 (33) | 43 | 0.4 | Horizontal |
| KDP | 1.51 | 10 ˜6 (63) | 48 | 0.2 | Vertical |
| $KTiOPO_4$ | 1.83 | 35 | 15.4 | 0.35 | Horizontal |
| $KTiOAsO_4$ | 1.8 | 40 (33) | 18 | | Vertical (11° Cutoff) |
| $Bi_{12}SiO_{20}$ | 2.5 | 5.0 (41) | 56 | 0.4 | |
| $Bi_{12}GeO_{20}$ | 2.1 | 1.0 (41) | 16 | 0.5 | Vertical |
| $Bi_{12}TiO_{20}$ | 2.56 | 5.75 (41) | | 0.45 | Vertical |
| GaAs | 3.5 | 1.4 (12) | 12 | 0.9 | Vertical |
| ZnTe | 3.1 | 4.3 (12) | 10 | 0.6 | Vertical |
| CdTe | 2.8 | 6.8 (12) | 9.4 | 0.9 | Vertical |

Generally, horizontal field probing is applicable to coplanar ICs, such as MMICs and ICs with few adjacent interconnections, but in the case of conventional ICs, spatial resolution is degraded by optical crosstalk and the like. Conversely, vertical field probing is sensitive to electric fields perpendicular to the IC surface, limiting application to the interconnections themselves, but provides good spatial resolution. Oxide crystals include KDP, $KTiOPO_4$, $LiNbO_3$ or other such ferroelectric electro-optic crystals, and compound semiconductors, such as GaAs and CdTe. Here, the crystal's permittivity becomes the capacitive load of the object to be measured. However, this load can be reduced when the distance between the probe and the IC surface is set to be as large as around 2 μm. Regarding spatial resolution, a probe-tip beam diameter of around 2 μm is considered to be the current limit.

The above explanation has been made with respect to a single probe sensor portion at the probe tip. However, U.S. Pat. No. 5,991,036 discloses an EOS apparatus in which a plurality of sensor portions are arranged in two dimensions, and electromagnetic radiation is processed to produce an image. In this disclosure, however, the electro-optic crystal layers of the sensor portions are spaced equidistantly from the object to be measured.

As described in the foregoing, the electro-optic sampling method of the prior art is used for point-by-point measurement, in three-dimensional space, of the electric field around the object to be measured. Therefore, when it is desired to obtain a three-dimensional image of the electric field distribution, the requisite measurements take a long time. In the case of the EOS apparatus that uses a plurality of sensor portions arranged in two dimensions and processes electromagnetic radiation to obtain an image, it is difficult simultaneously to measure the electric field strength that is dependent on the distance from the object to be measured.

An object of the present invention is to provide a method and apparatus for three-dimensional measurement of electric field distribution that enables rapid measurement and imaging of the three-dimensional distribution of the electric field in microdomains.

SUMMARY OF THE INVENTION

To attain the above object, the present invention provides a method of measuring a three-dimensional distribution of an electric field in a direction of separation from an object to be measured, using a measurement probe, with little disturbance to the electric field, the method comprising the steps of making a first measurement using a plurality of electric field sensors for electro-optic sampling, each comprising an electro-optic crystal layer, a light reflection layer that is in close contact with the electro-optic crystal layer and a separation layer that is formed of a material identical to that of the electro-optic crystal layer and is in close contact with the reflection layer to separate the reflection layer from the object to be measured, in which electric field strength at a predetermined point is measured using a first electric-field sensor having a first electro-optic crystal layer and a first separation layer, and making a second measurement in which electric field strength at the predetermined point is measured using a second electric-field sensor having a second electro-optic crystal layer and a second separation layer, wherein the second measurement is made satisfying conditions that the first electro-optic crystal layer and the second electro-optic crystal layer are formed of a same material, that a sum thickness of the first electro-optic crystal layer and the first separation layer equals a sum thickness or the second electro-optic crystal layer and the second separation layer and that the first separation layer and second separation layer have different thicknesses.

The object is also attained by an apparatus for measuring a three-dimensional distribution of an electric field, comprising an electric field sensor array comprising a plurality of electric field sensors for electro-optic is sampling; a light source that irradiates the electric field sensor array with a probe light; a detector that measures the light reflected as polarized light; and means that uses intensity of the polarized light to measure strength of the electric field; each of the sensors comprising an electro-optic crystal layer, a separation layer that separates the electro-optic crystal layer from an object to be measured and is constituted of a same material as the electro-optic crystal layer, and a light reflection layer, in which a sum thickness or the separation layer and electro-optic crystal layer of each sensor is a constant.

In the apparatus, the separation layer has a plane surface in contact with the object to be measured.

The apparatus further comprises a microscope through which light that irradiates the electric field sensor array is passed and means that can observe a degree of polarization of the light reflected via the microscope.

The apparatus further comprises a two-dimensional imaging apparatus that includes a polarized light detector that captures light reflected from the reflection layer of each of the sensors of the electric field sensor array simultaneously irradiated by the probe light, and image-processing means that processes the separation layer thickness as a distance from the object to be measured to form a three-dimensional image.

In the apparatus, the electric field sensor array can comprise a row of one-dimensional sub-arrays of a plurality of electric field sensors with different separation layer thickness for electro-optic sampling, each of the sensors being constituted of an electro-optic crystal layer, a separation layer that separates the electro-optic crystal layer from an object to be measured, and a light reflection layer, wherein a three-dimensional image of an electric field strength distribution is formed by sweeping the object to be measured in a direction that is orthogonal to an array direction of the sensors.

In the apparatus, the electric field sensor array can comprise a row of columns of two-dimensional sub-arrays of a plurality of electric field sensors for electro-optic sampling. Each of the two-dimensional sub-arrays is same with the other. Each of the sensors is constituted of an electro-optic crystal layer, a separation layer that separates the electro-optic crystal layer from an object to be measured, and a light reflection layer.

Thus, as described, the method and apparatus for three-dimensional measurement of electric field distribution use an electric field sensor array in which the plurality of separation layers have different thicknesses, thereby enabling measurement of the three-dimensional electric field distribution with the electric field sensor array in close contact with the object to be measured, making it possible to shorten the measurement time.

BRIEF EXPLANATION OF THE DRAWINGS

FIG. 3 shows sub-arrays of the sensor array used in the apparatus of FIG. 2, with FIG. 3(a) showing an example in which the separation layer thickness is changed in a stepped manner, FIG. 3(b) showing an example in which the separation layer is sloped to change the thickness, and FIG. 3(c) showing an example in which the electro-optic crystal layer and the separation layer are constituted with the same permittivity.

FIG. 9 illustrates the principle of the prior art electric field measurement using an electro-optic crystal, with FIG. 9(a) showing the configuration thereof and FIG. 9(b) showing a periodically repeating signal waveform.

FIG. 10 illustrates electric field probing in the measurement method of FIG. 9, with FIG. 10(a) showing vertical probing and FIG. 10(b) showing horizontal probing.

DESCRIPTION OF THE PREFERRED EMBODIMENT

Details of the embodiments of the invention will now be described with reference to the drawings. In the explanation, elements and apparatuses having the same or similar functions are denoted using the same reference symbols.

Figure 1:
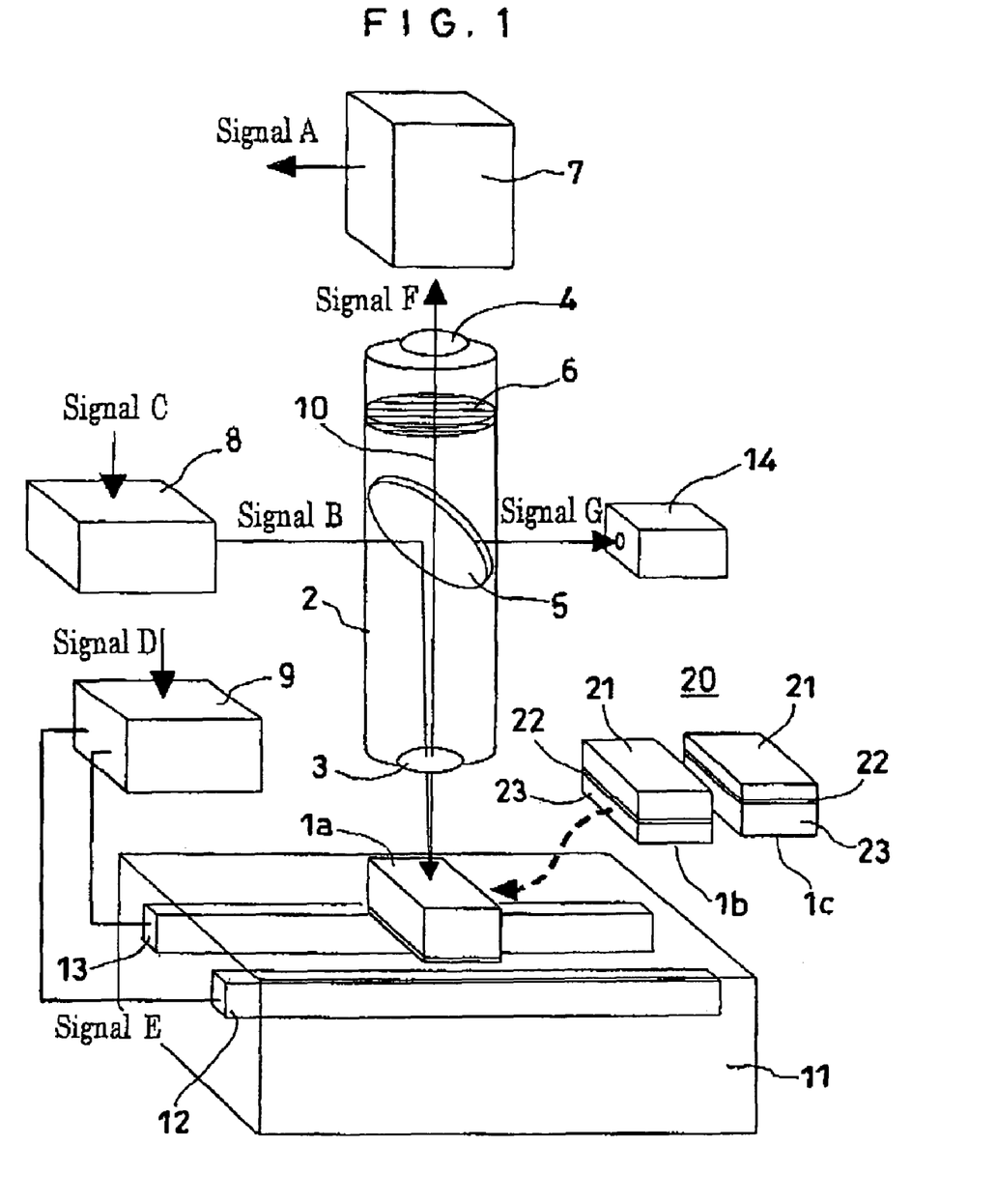
FIG. 1 is a schematic diagram showing a preferred aspect of a first embodiment of the apparatus for three-dimensional measurement of the electric field distribution according to the invention.

FIG. 1 shows a preferred aspect of a first embodiment of the apparatus used for three-dimensional measurement of electric field distribution according to the invention, showing the electro-optic sampling (EOS) probing apparatus and a part of the apparatus required to operate the probing apparatus. The EOS probing apparatus 20 comprises a microscope 2 and exchangeable electric field sensor portions 1a, 1b and 1c. In accordance with a pulse signal B from an active mode-locked laser 8 triggered by a signal C, the EOS probing apparatus 20 uses a beam-splitter 5 of the microscope to split the light into a beam directed to an objective lens 3 and a beam (a signal G) directed to a high-speed optical detector 14. Light that passes through the objective lens 3 is polarization-modulated by the electric field sensor portion 1a, 1b or 1c and reflected back to the objective lens 3. After passing through the objective lens 3 and the beam-splitter 5, the light passes along an optical path 10, is selected by a polarizing plate 6, passes through an eyepiece 4 and enters an optical detector 7 as a signal F.

Figure 4:
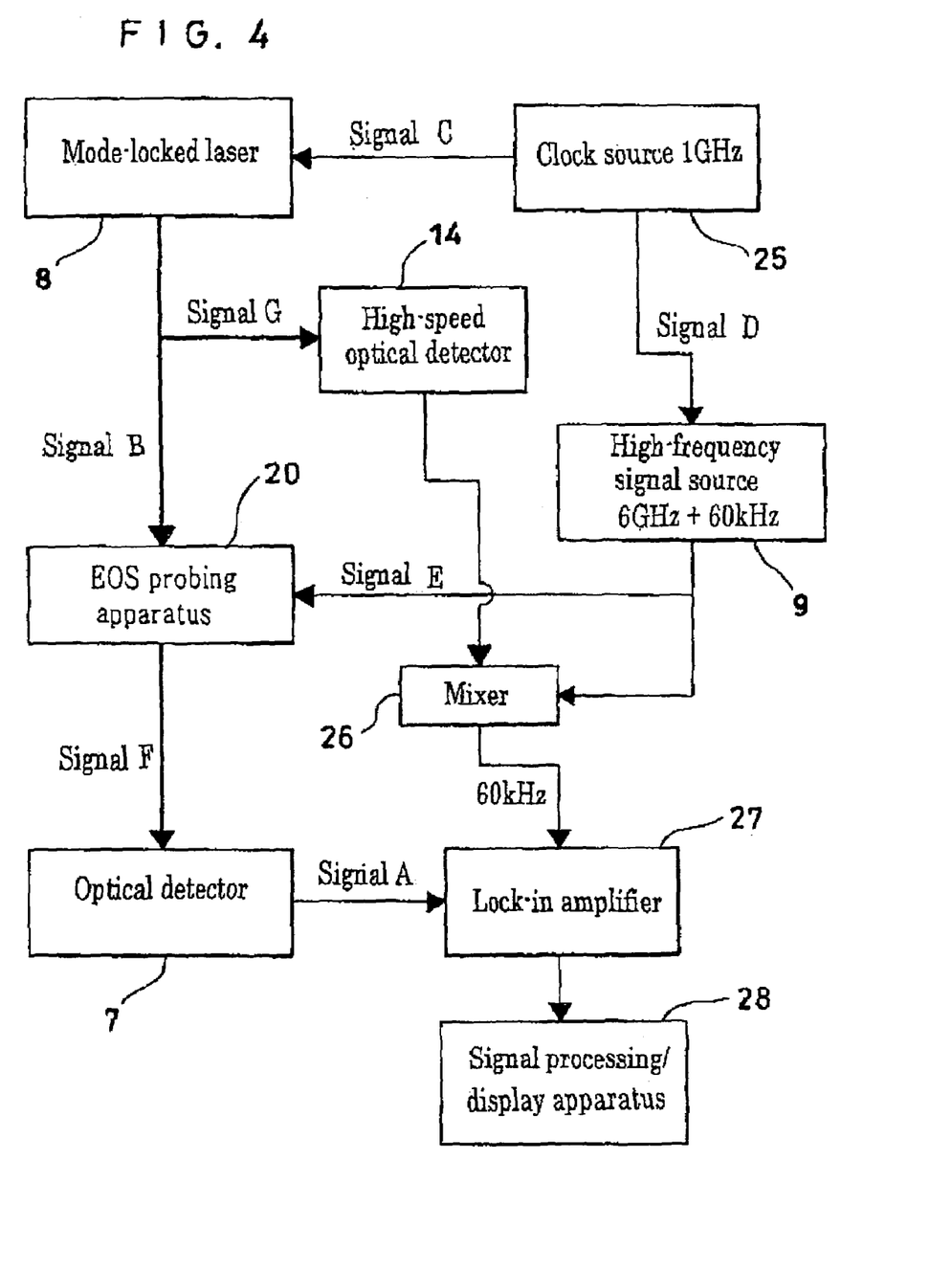
FIG. 4 is a block diagram of a signal processing system.

The signal A that is the output of the optical detector 7 reflects the modulation imposed by the electric field sensor portion 1a, 1b or 1c, and so the electric field strength at the electric field sensor portion 1a, 1b or 1c can be known from the strength of the signal A output by the optical detector 7. As shown in FIG. 4, the signal A is sent to a lock-in amplifier 27, where synchronous detection takes place using a reference signal of a low frequency (e.g., 60 kHz) formed by a mixer 26 by combining a signal from a high-frequency signal source 9 triggered by a signal D of a frequency that is 1 GHz, for example, with a signal from a high-speed optical detector 14. The signal E from the high-frequency signal source 9 is applied between the electrodes 12 and 13. The output of the lock-in amplifier 27 is displayed by means of a signal-processing/displaying apparatus 28.

The electric field sensor portions 1a, 1b and 1c are exchangeable. Each of these electric field sensor portions is comprised of an electro-optic crystal layer 21, a reflection layer 22 and a separation layer 23. The thickness of the separation layer is gradually increased from sensor portion 1a to 1b to 1c. The electro-optic crystal layer 21 and separation layer 23 are formed of the same material, and the sensor portions 1a to 1c are fabricated so that in each case, the sum thickness of the electro-optic crystal layer 21 and separation layer 23 is the same. The reflection layer 22 is formed as a laminate or multiple layers of a well-known dielectric, and can be formed thin compared to the electro-optic crystal layer 21 or separation layer 23. This configuration makes it possible to ignore any differences in electric field irregularity at the surface of the object to be measured.

To perform measurements, the sensor portion is put into close contact with the surface of the object 11 to be measured. For this, it is preferable for the bottom surface of the separation layer, that is, the surface in contact with the object to be measured, to be flat. The strength of the electric field can also be measured at a point further away from the surface by providing a spacing sheet between the object 11 to be measured and the sensor portion 1a, 1b or 1c. It is also preferable to provide the surface of the electric field sensor portion with an anti-reflection film (not shown).

Figure 5:
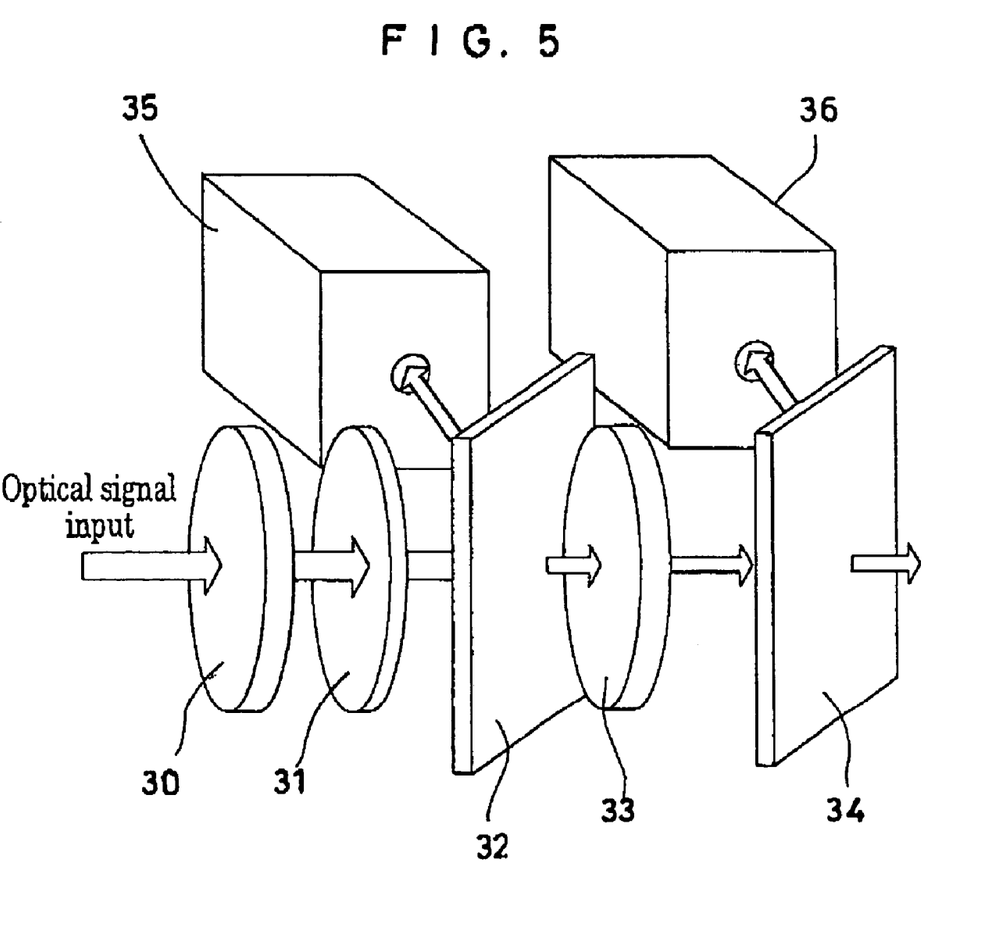
FIG. 5 is a schematic diagram showing the configuration of an optical detector.
Figure 6:
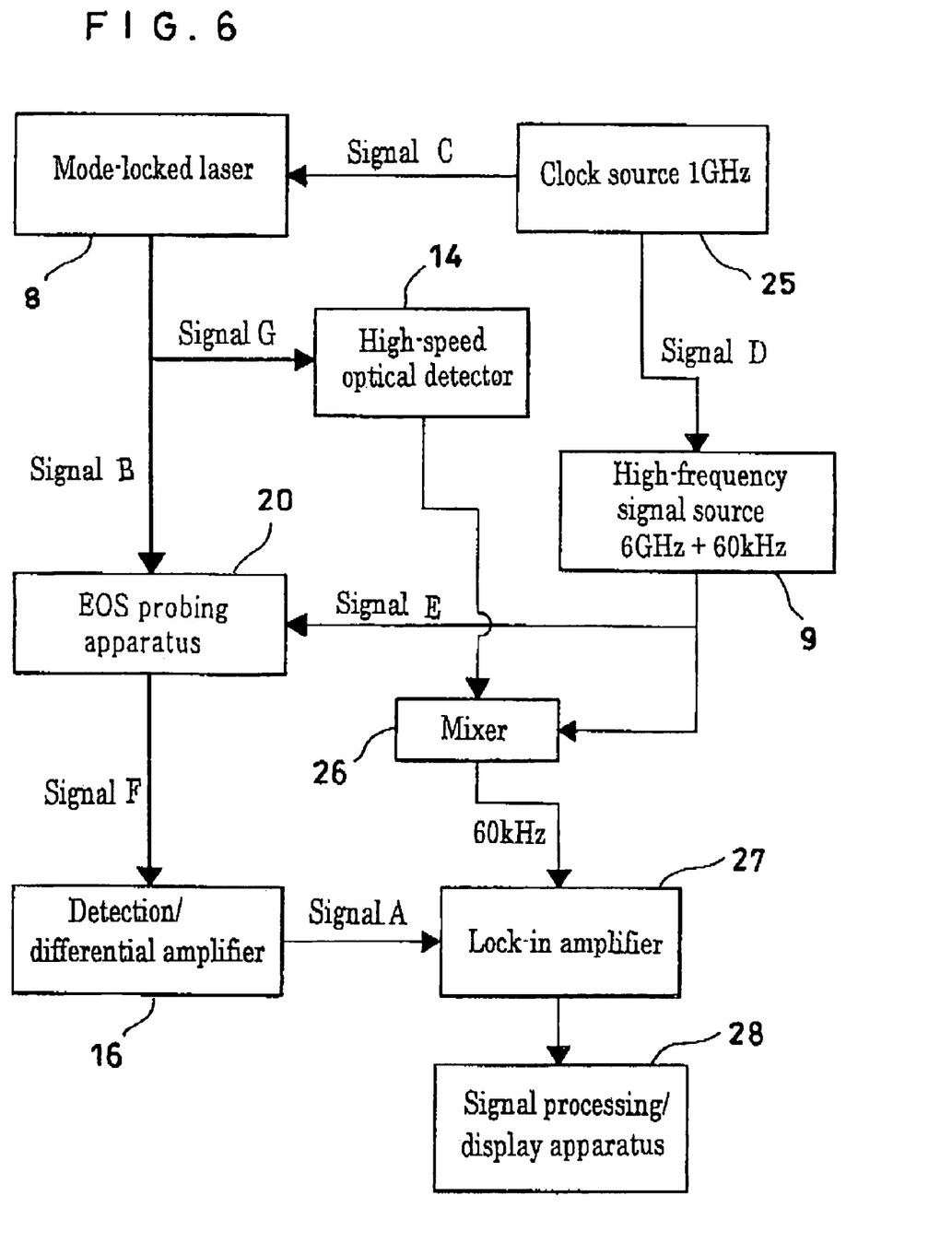
FIG. 6 is a block diagram of another signal processing system.

In some cases, the polarized-light detection sensitivity of the apparatus shown in FIG. 1 may not be enough. In such a case, as shown in FIG. 6, sufficient sensitivity can be obtained by using an optical detection/differential amplifier 16 to obtain the output difference between optical detectors 35 and 36 (FIG. 5) used to detect the intensity of orthogonal light components, followed by signal processing by the lock-in amplifier 27. In FIG. 5, reference numerals 30 and 31 denote ½-wavelength plates, numeral 32 a ¼-wavelength plate, and numeral 33 and 34 polarizing beam-splitters.

Figure 2:
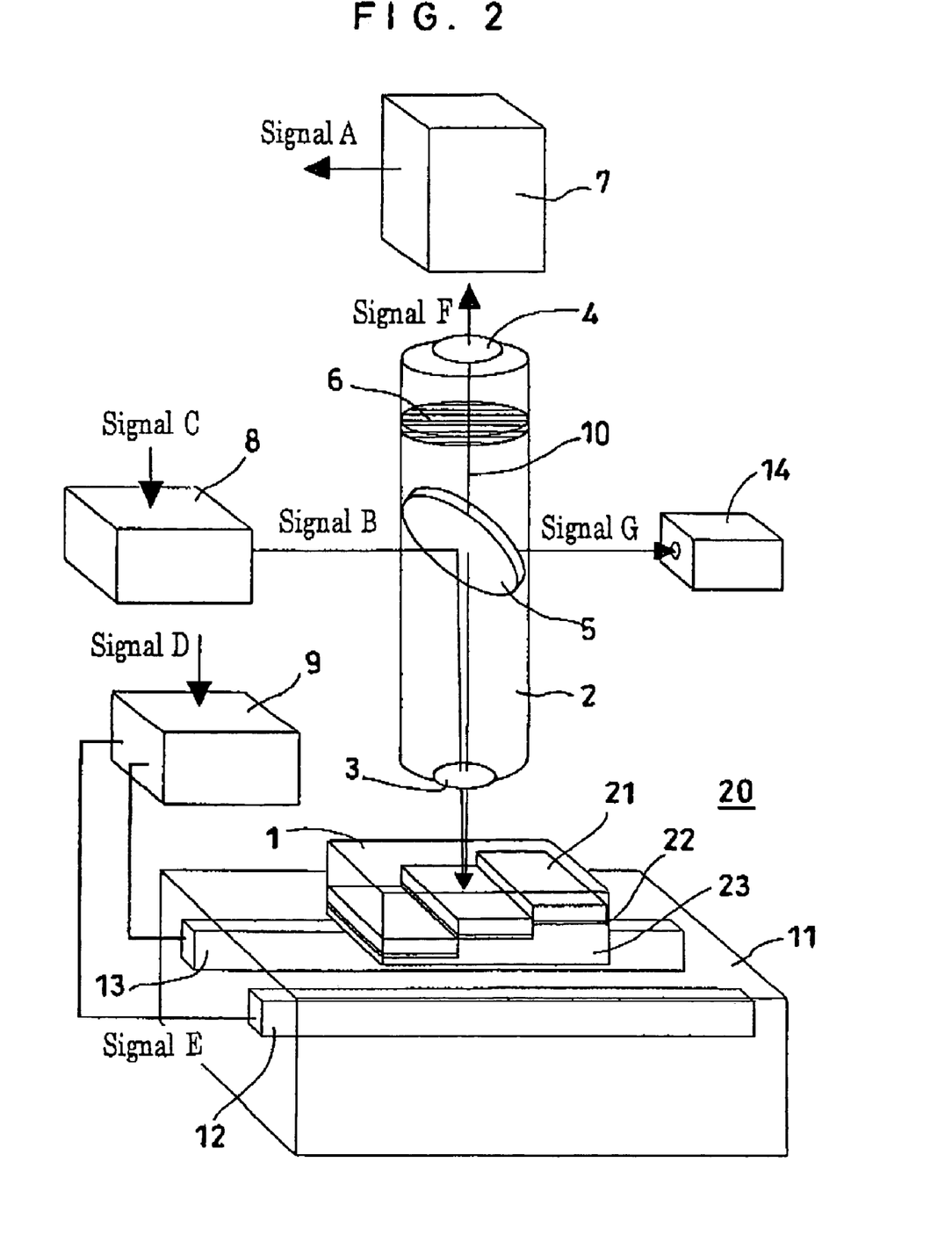
FIG. 2 is a schematic diagram showing a preferred aspect of a second embodiment of the apparatus for three-dimensional measurement of the electric field distribution according to the invention.
Figure 3A:
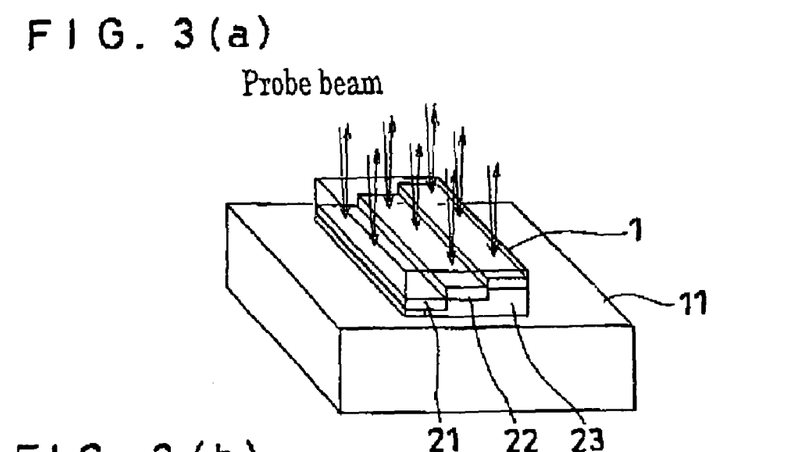
Figure 3B:
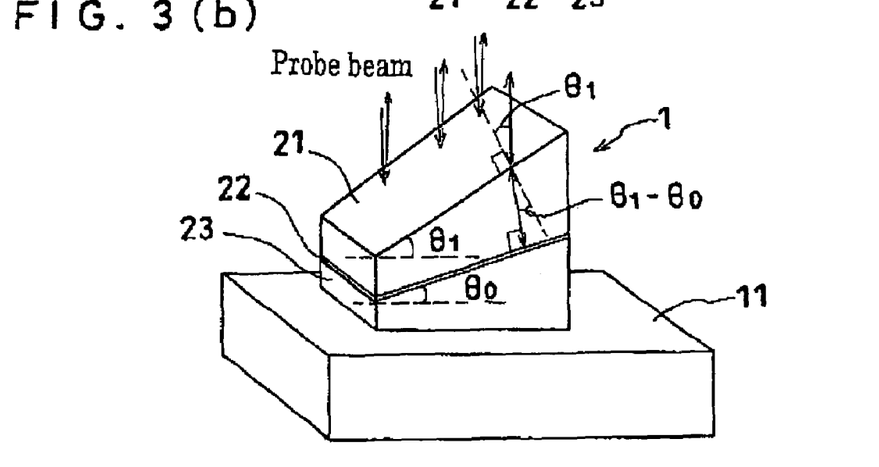
Figure 3C:
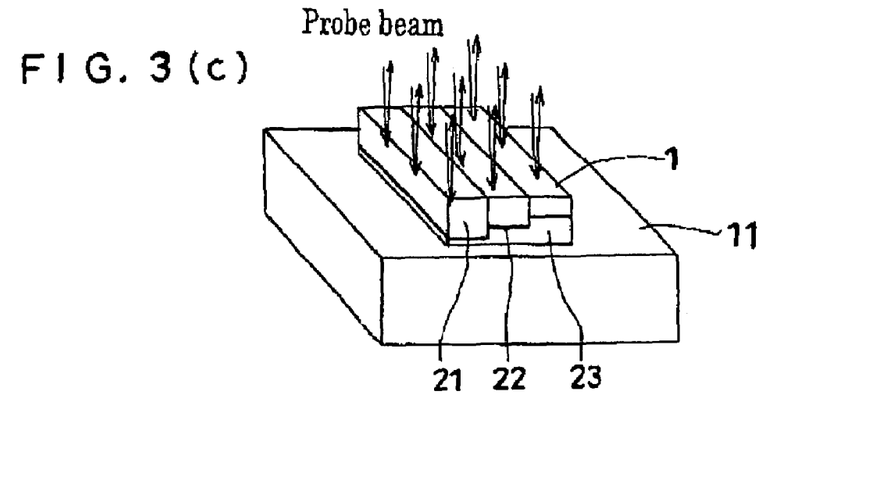

FIG. 2 shows a preferred aspect of a second embodiment of the measurement apparatus according to the invention, showing the EOS probing apparatus 20 and a part of the apparatus required to operate the probing apparatus. FIG. 3 shows array elements of the sensor portion 1. The elements of FIGS. 3(a) and 3(b) are arranged one- and two-dimensionally, respectively. FIG. 4 shows the signal processing system. The electric field sensor portion 1 is an electric field sensor array, shown in detail in FIG. 3. FIGS. 3(a), 3(b) and 3(c) show sub-arrays of the electric field sensor array. The sub-array of FIG. 3(a) is the same as the sub-array used for the sensor portion 1 shown in FIG. 2. The electric field sensor sub-array is comprised of a plurality of sub-array elements constituted by the electro-optic crystal layer 21, reflection layer 22 and separation layer 23. In FIG. 3(a), the three sub-array elements form a continuous configuration, in which the separation layer is stepped to form the plural portions of different thicknesses. The sub-array shown in FIG. 3(a) has three stages, but can have more stages using an electric field sensor array comprised of iterations of this stepped sub-array makes it possible to measure a desired portion without moving the sensor portion.

To perform the measurement, the sensor portion is generally brought into close contact with the surface of the object 11 to be measured. For this, it is preferable for the bottom surface of the separation layer, which is the surface in contact with the object to be measured, to be flat. The strength of the electric field can also be measured at a point further away from the surface by providing a spacing sheet between the object 11 to be measured and the sensor portion 1.

While FIG. 3(a) shows the electric field sensor array as having a stepped configuration, it can have a sloped configuration as shown in FIG. 3(b). In this case, if $\theta_1$ is the angle formed between the surface of the electro-optic crystal layer 21 and the surface of the object 11 to be measured and $\theta_0$ is the angle formed between the surface of the separation layer 23 and the surface of the object 11 to be measured, in order to have the beam fall perpendicularly incident on the surface of the reflection layer 22, it is desirable to set $\theta_1$ and $\theta_0$ to satisfy the following condition. Namely, $\sin\theta_1 = n \times \sin(\theta_1 - \theta_0)$, n being the refractive index or the electro-optic crystal layer 21.

In the case of the electric field sensor sub-array shown in FIG. 3(c), the surface of the electro-optic crystal layer 21 is constituted of a material having the same permittivity as that of the separation layer 23, and the sum thickness of these layers is set to be the same in each of the sub-array elements. The electro-optic crystal layer 21 and separation layer 23 can also be formed of the same material. With this configuration, the effect that the electric field around the object to be measured has on the electric field sensor array is uniform, and therefore can readily be corrected. It is also desirable for the permittivity to be close to that of the environment in which the object to be measured is used. When it is used in the air, the permittivity should be as low as possible. Also, when setting the above sum thickness to be the same in each of the sub-array elements, since the modulation effect used to polarize the light will differ, the thickness is normalized, and conversion processing is used to obtain a measurement value with respect to a electro-optic crystal layer having a fixed thickness. It is also preferable to provide the surface of the electric field sensor portion with an anti-reflection film (not shown).

In some cases, the polarized-light detection sensitivity of the apparatus shown in FIG. 2 may be insufficient. In such a case, as shown in FIG. 6, sufficient sensitivity can be obtained by using the optical detection/differential amplifier 16 to obtain the output difference between the optical detectors 35 and 36 (FIG. 5) used to detect the intensity of the orthogonal light components, followed by signal processing by the lock-in amplifier 27.

Figure 7:
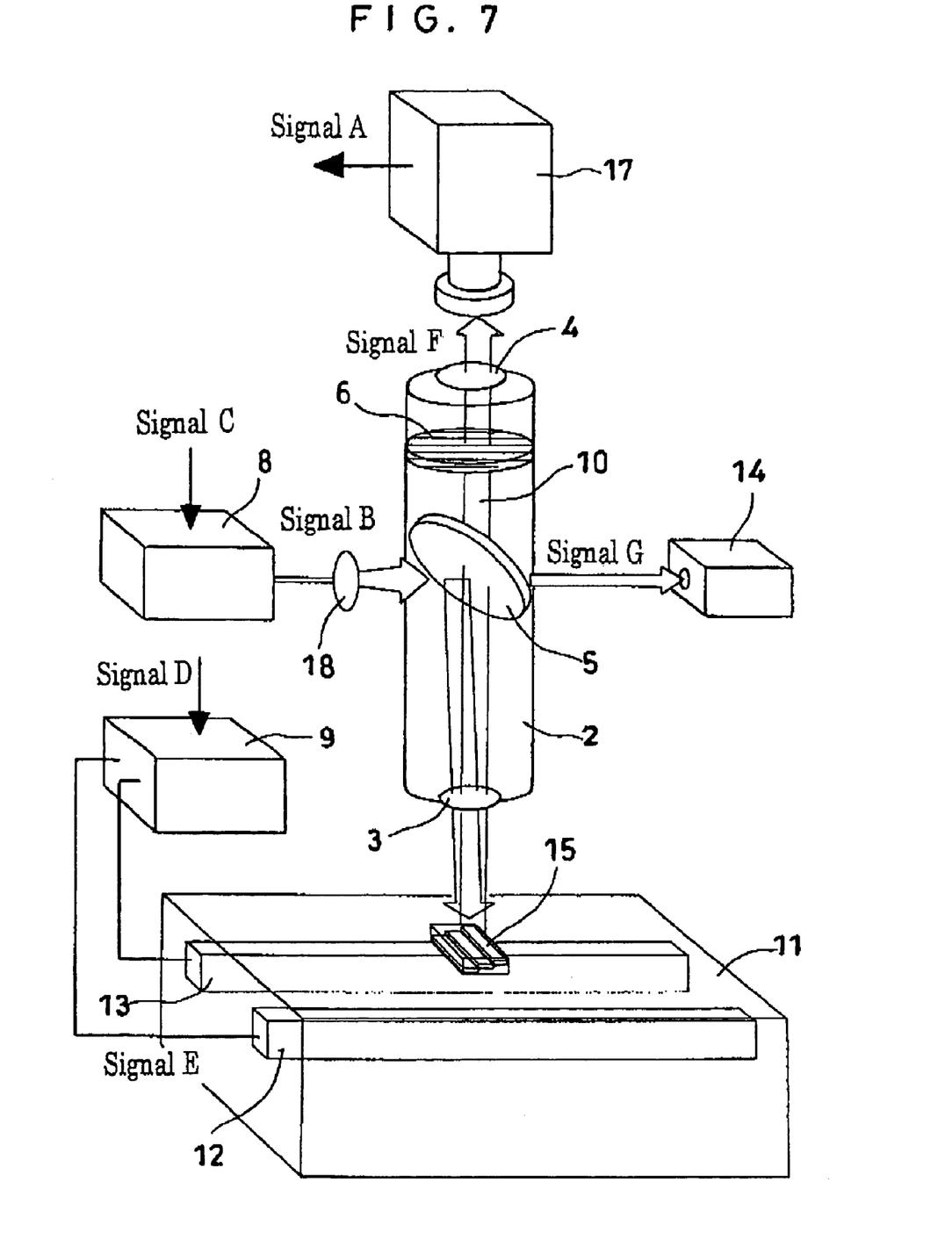
FIG. 7 is a schematic diagram showing a preferred aspect of a third embodiment of the apparatus used for three-dimensional measurement of the electric field distribution according to the invention.

FIG. 7 shows a third embodiment of the measurement apparatus. The apparatus of FIG. 7 is characterized in that the probe beam irradiates a broad range of the electric field sensor portion 15 and that a two-dimensional image of the irradiated portion is obtained. In the EOS probing apparatus 21, a beam forming an optical pulse signal a emitted by an active mode-locked laser 6 that is expanded by a beam expander 18 is split by the beam-splitter of a microscope into a beam directed to an objective lens 3 and a beam directed to a high-speed optical detector 14. Light that passes through the objective lens 3 is subjected to polarization modulation by the electric field sensor portion 15 corresponding to each point thereof and is reflected back to the objective lens 3. After passing through the objective lens 3 and the beam-splitter 5, the light travels along the optical path 10 and, after being selected by a polarizing plate, passes through an eyepiece 4 and enters an optical detector 17 that is an imaging apparatus.

Figure 8:
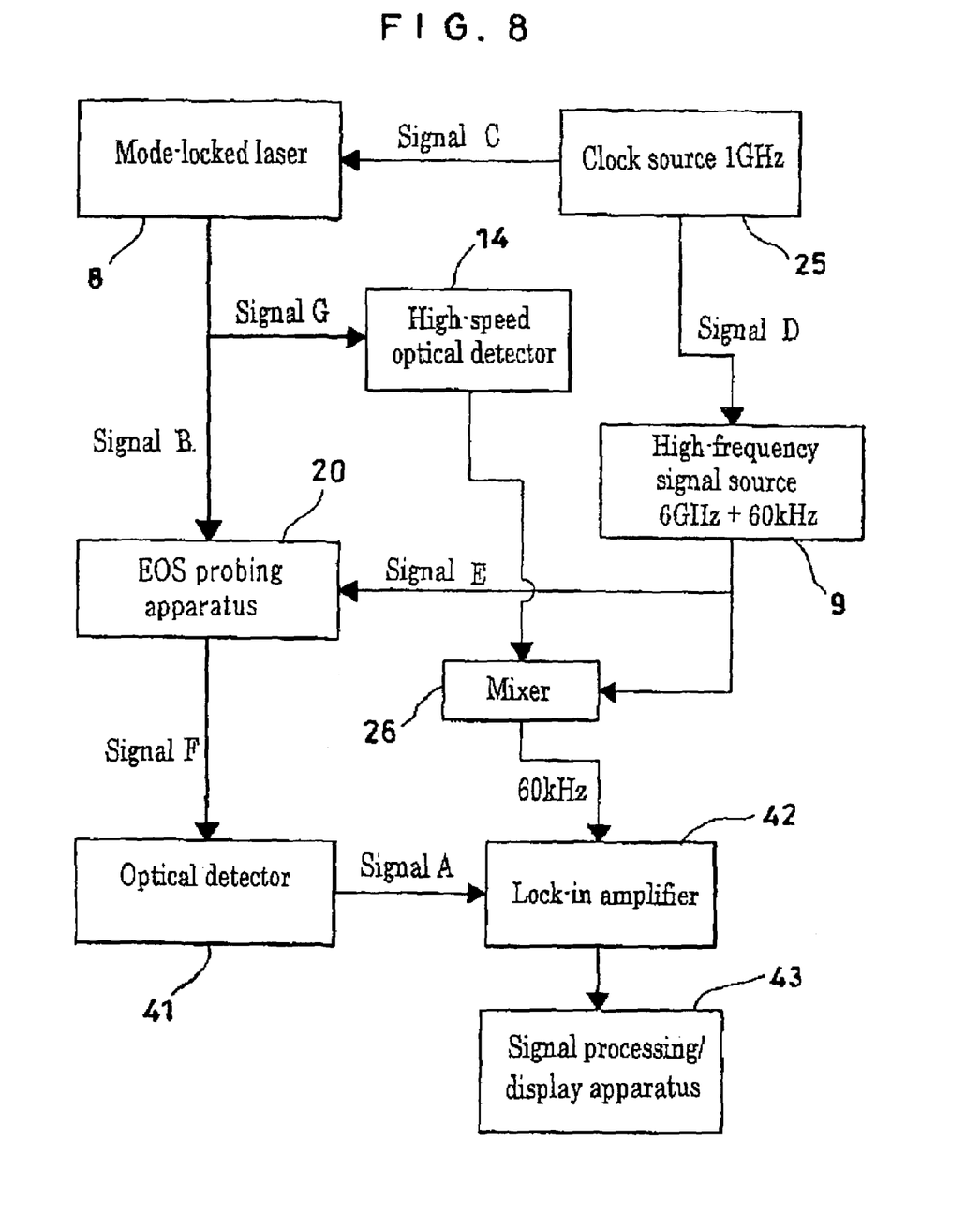
FIG. 8 is a block diagram of still another signal processing system.

With reference to FIG. 8, the signal A that is the output of the optical detector 17 reflects the modulation imposed by the electric field sensor portion 15, whereby the electric field strength at the electric field sensor portion can be known from the strength of the signal A output by the optical detector 17. Pixel by pixel, the signal A is sent to a lock-in amplifier 42, where synchronous detection takes place using a low-frequency reference signal formed by a mixer 26 by combining a signal from a high-frequency signal source 9 with a signal from a high-speed optical detector 14. The output of the lock-in amplifier 42 is displayed by means of a two-dimensional array data signal-processing/displaying apparatus 43. Denoted by reference numeral 41 is an optical detector.

Any of the materials listed in Table 1 can be used for the electric field sensor portion. A material, such as CdTe that has a low permittivity, is suitable for the electro-optic crystal layer. For the reflection layer, a multilayer dielectric reflective film comprised of titanium dioxide or silicon dioxide layers or the like is suitable. A material, such as the same CdTe used for the electro-optic crystal layer, is suitable for the separation layer.

The invention configured as described in the foregoing has the following effects.

By using an electric field sensor array with a plurality of separation layer portions having different thicknesses, the three-dimensional electric field distribution can be measured with the electric field sensor array in close contact with the object to be measured. Also, since the surface of the separation layer in contact with the object to be measured is made flat, settings in the height direction are stable. This stability is also provided by the ability to use a microscope to observe the degree of polarization of the reflected probe beam. Also, measurements are speeded up by the ability to use a two-dimensional imaging apparatus to observe the degree of polarization of the reflected probe beam. Moreover, using a one-dimensional electric field sensor array makes it easier to manufacture the sensor array and facilitates processing of observed signals. Measurement of the electric field distribution is also speeded up by the use of a two-dimensional sensor array.

What is claimed is:

1. A method of measuring a three-dimensional distribution of an electric field in a direction of separation from an object to be measured, comprising the steps of;

making a first measurement using a plurality of electric field sensors for electro-optic sampling, each of sensors comprising an electro-optic crystal layer, a light-reflection layer that is in close contact with the electro-optic crystal layer and a separation layer that is formed of a material identical to that of the electro-optic crystal layer and is in close contact with the reflection layer to separate the reflection layer from the object to be measured, in which electric field strength at a predetermined point is measured using a first electric field sensor having a first electro-optic crystal layer and a first separation layer; and making a second measurement in which electric field strength at the predetermined point is measured using a second field sensor having a second electro-optic crystal layer and a second separation layer, wherein the second measurement is made satisfying conditions that the first electro-optic crystal layer and the second electro-optic crystal layer are formed of a same material, that a sum thickness of the first electro-optic crystal layer and the first separation layer equals a sum thickness of the second electro-optic crystal layer and the second separation layer, and that the first separation layer and second separation layer have different thicknesses.

2. An apparatus for measuring a three-dimensional distribution and an intensity or an electric field, comprising:

an electric field sensor array comprising a plurality of electric field sensors for electro-optic sampling;

a light source that irradiates the electric field sensor array with a probe light; and a detector that measures the light reflected as polarized light; and means that uses intensity of the polarized light to measure strength of the electric field;

each of the sensors comprising an electro-optic crystal layer, a separation layer that separates the electro-optic crystal layer from an object to be measured and is constituted of a same material as the electro-optic crystal layer, and a light reflection layer, in which a sum thickness of the separation layer and electro-optic crystal layer of each sensor is a constant.

3. The apparatus according to claim 2, in which the separation layer has a plane surface in contact with the object to be measured.

4. The apparatus according to claim 2, further comprising a microscope through which light that irradiates the electric field sensor array is passed and means that can observe a degree of polarization of the light reflected via the microscope.

5. The apparatus according to claim 2, further comprising a two-dimensional imaging apparatus that includes a polarized light detector that captures light reflected from the reflection layer of each of the sensors of the electric field sensor array simultaneously irradiated by the probe light, and image-processing means that processes the separation layer thickness as a distance from the object to be measured to form a three-dimensional image.

6. The apparatus according to claim 2, in which the electric field sensor array comprises a row of one-dimensional sub-arrays of a plurality of electric field sensors for electro-optic sampling, each of the sensors being constituted of an electro-optic crystal layer, a separation layer that separates the electro-optic crystal layer from an object to be measured, and a light reflection layer, wherein a three-dimensional image of an electric field strength distribution is formed by sweeping the object to be measured in a direction that is orthogonal to an array direction of the sensors.

7. The apparatus according to claim 3, in which the electric field sensor array comprises a row of one-dimensional sub-arrays of a plurality of electric field sensors for electro-optic sampling, each of the sensors being constituted of an electro-optic crystal layer, a separation layer that separates the electro-optic crystal layer from an object to be measured, and a light reflection layer, wherein a three-dimensional image of an electric field strength distribution is formed by sweeping the object to be measured in a direction that is orthogonal to an array direction of the sensors.

8. The apparatus according to claim 4, in which the electric field sensor array comprises a row of one-dimensional sub-arrays of a plurality of electric field sensors for electro-optic sampling, each of the sensors being constituted of an electro-optic crystal layer, a separation layer that separates the electro-optic crystal layer from an object to be measured, and a light reflection layer, wherein a three-dimensional image of an electric field strength distribution is formed by sweeping the object to be measured in a direction that is orthogonal to an array direction of the sensors.

9. The apparatus according to claim 5, in which the electric field sensor array comprises a row of one-dimensional sub-arrays of a plurality of electric field sensors for electro-optic sampling, each of the sensors being constituted of an electro-optic crystal layer, a separation layer that separates the electro-optic crystal layer from an object to be measured, and a light reflection layer, wherein a three-dimensional image of an electric field strength distribution is formed by sweeping the object to be measured in a direction that is orthogonal to an array direction of the sensors.

10. The apparatus according to claim 5, in which the electric field sensor array comprises a row of columns of two-dimensional sub-arrays of a plurality of electric field sensors for electro-optic sampling, each of the sensors being constituted of an electro-optic crystal layer, a separation layer that separates the electro-optic crystal layer from an object to be measured, and a light reflection layer.

* * * * *